United States Patent
Ozturk et al.

(10) Patent No.: US 11,847,531 B1
(45) Date of Patent: *Dec. 19, 2023

(54) SYSTEM AND METHOD FOR USING ARTIFICIAL INTELLIGENCE TO DETECT LITHIUM PLATING

(71) Applicant: Eatron Technologies Limited, Warwick (GB)

(72) Inventors: Anil Ozturk, Istanbul (TR); Mustafa Burak Gunel, Istanbul (TR); Muharrem Ugur Yavas, Istanbul (TR); Can Kurtulus, Istanbul (TR)

(73) Assignee: Eatron Technologies Limited, Warwick (GB)

(*) Notice: Subject to any disclaimer, the term of this patent is extended or adjusted under 35 U.S.C. 154(b) by 0 days.

This patent is subject to a terminal disclaimer.

(21) Appl. No.: 18/189,657

(22) Filed: Mar. 24, 2023

Related U.S. Application Data

(63) Continuation of application No. 18/184,305, filed on Mar. 15, 2023.

(60) Provisional application No. 63/482,353, filed on Jan. 31, 2023.

(51) Int. Cl.
*G06N 5/022* (2023.01)

(52) U.S. Cl.
CPC .................. *G06N 5/022* (2013.01)

(58) Field of Classification Search
CPC .................................................. G06N 5/022
See application file for complete search history.

(56) References Cited

U.S. PATENT DOCUMENTS

| | | | | |
|---|---|---|---|---|
| 10,481,623 | B1* | 11/2019 | Forouzan | G05B 13/048 |
| 10,566,819 | B2* | 2/2020 | Barsukov | H02J 7/00 |
| 2019/0025376 | A1* | 1/2019 | Saha | H01M 10/054 |
| 2019/0113577 | A1* | 4/2019 | Severson | G01R 31/3842 |
| 2020/0014079 | A1* | 1/2020 | Love | H01M 4/382 |
| 2020/0363475 | A1* | 11/2020 | Han | H01M 10/0525 |
| 2022/0179003 | A1* | 6/2022 | Baumann | H01M 10/0525 |

FOREIGN PATENT DOCUMENTS

| | | | | |
|---|---|---|---|---|
| CN | 154369 | * | 11/2004 | H02J 7/00 |
| CN | 205211845 U | * | 5/2016 | H01M 6/14 |
| CN | 208690424 U | * | 4/2019 | Y02P 70/50 |
| JP | 2019-113524 A | * | 7/2019 | |

* cited by examiner

*Primary Examiner* — Tung S Lau
(74) *Attorney, Agent, or Firm* — Dickinson Wright PLLC; Jonathan H. Harder

(57) ABSTRACT

In one aspect, computer-implemented method may include receiving, from computing devices, fleet data pertaining to battery packs each including first cells. The fleet data includes false positive images of lithium plating affecting at least a first cell, true positive images of the lithium plating affecting at least a second cell, or both. The method may include training, using at least the fleet data, machine learning models to predict occurrences of the lithium plating, receiving, from sensors associated with second cells, measurements pertaining to current, voltage, temperature, or some combination thereof, and inputting the measurements into the machine learning models to predict the occurrences of the lithium plating for the second cells.

20 Claims, 12 Drawing Sheets

| Time | Current | Cell 1 Volt | Cell 2 Volt | Cell 3 Volt | ... | Cell N Volt |
|---|---|---|---|---|---|---|
| 1.65E+09 | -0.68 | 3.623125 | 3.635625 | 3.63625 | ... | 3.63625 |
| 1.65E+09 | -0.86 | 3.624375 | 3.636875 | 3.63625 | ... | 3.63625 |
| 1.65E+09 | -0.68 | 3.624375 | 3.635625 | 3.635625 | ... | 3.635625 |
| 1.65E+09 | -1.08 | 3.624375 | 3.635625 | 3.63625 | ... | 3.636875 |
| 1.65E+09 | -1.08 | 3.62375 | 3.63625 | 3.63625 | ... | 3.6375 |

FIG. 7

SYSTEM AND METHOD FOR USING ARTIFICIAL INTELLIGENCE TO DETECT LITHIUM PLATING

CROSS-REFERENCES TO RELATED APPLICATIONS

This application is a continuation of U.S. patent Ser. No. 18/184,305 filed Mar. 15, 2023, titled "SYSTEM AND METHOD FOR USING ARTIFICIAL INTELLIGENCE TO DETECT LITHIUM PLATING," which claims priority to U.S. Application Patent Ser. No. 63/482,353 filed Jan. 31, 2023, titled "SYSTEM AND METHOD FOR USING ARTIFICIAL INTELLIGENCE TO DETECT LITHIUM PLATING," the entire disclosures of which are hereby incorporated by reference for all purposes.

TECHNICAL FIELD

This disclosure relates generally to assets and batteries. More specifically, this disclosure relates to systems and methods for using artificial intelligence to detect lithium plating in assets and batteries.

BACKGROUND

Many industries involve assets that age and reach End of Life (EOL) states where they are no longer useful. One such example includes energy storage solutions that are prevalent in many assets including personal laptops, mobile phones, electronic watches, rings, and other wearable devices. Further, assets including gate valves used in nuclear reactor control systems, turbofan engines, solid state disks, and other industrial applications are valuable and have limited useful lifetimes. Each asset and/or battery may be prone to degradation issues.

In one example, among various energy storage solutions, Lithium-ion (Li-ion) batteries are widely regarded as promising candidates for various applications due to their advantages of high energy density and low self-discharge. However, the life span of Li-ion batteries is not unlimited, and the cost and aging of Li-ion batteries may be two main factors hindering their development. The performance of Li-ion batteries degrades with time (calendar aging) and use (cycle aging), which is referred to as the aging phenomenon. The aging of the battery may increase operating costs, reduce the service life of the equipment, and affect the safe operation of the equipment.

Moreover, there may not be an ideal solution for recycling of Li-ion batteries. Predictive maintenance may enable mechanisms to be in place for handling of batteries before they reach their EOL reducing demands on recycling. Additionally, premature failures of the batteries may increase demands on re-cycling. Generally, when battery capacity drops below a target threshold i.e. 70-80% of initial battery capacity for an automotive-grade battery, the battery may have reached the end of its service life. The target threshold may vary between different applications.

When Li-ion battery is being charged or discharged, lithium ions move between the negative electrode and the positive electrode. In certain temperatures (e.g., cold) and fast-charging situations, the lithium ions can begin to deposit on the surface of the negative electrode, forming a layer of lithium metal. This phenomenon may be referred to as "lithium plating," which may greatly reduce the battery's lifespan and hinder its fast-charging capabilities. In severe cases, lithium plating may cause short circuits.

SUMMARY

In one aspect, a computer-implemented method may include receiving one or more measurements from one or more sensors of a battery pack including one or more battery cells. The method may include generating, using the one or more measurements, one or more voltage profiles for the one or more cells, performing, based on the one or more voltage profiles, one or more transformations for the one or more cells, identifying, based on the one or more transformations, one or more mean-comparison features for the one or more cells, and training, based at least on the one or more mean-comparison features, one or more machine learning models to predict one or more occurrences of lithium plating for the one or more cells.

In one aspect, a computer-implemented method may include receiving, from one or more computing devices, fleet data pertaining to one or more battery packs each including one or more first cells. The fleet data includes one or more false positive time series data of lithium plating affecting at least a first cell, one or more true positive time series data of the lithium plating affecting at least a second cell, or both. The method may include training, using at least the fleet data, one or more machine learning models to predict one or more occurrences of the lithium plating, receiving, from one or more sensors associated with one or more second cells, one or more measurements pertaining to current, voltage, temperature, or some combination thereof, and inputting the one or more measurements into the one or more machine learning models to predict the one or more occurrences of the lithium plating for the one or more second cells.

In one aspect, while a battery pack is charging, a computer-implemented method may include receiving, from one or more sensors, one or more measurements associated with the battery pack, wherein the one battery pack comprises one or more cells. The method may include separating the one or more measurements into separate profiles for the one or more cells. The separate profiles include data pertaining to current, voltage, temperature, or some combination thereof. The method may include identifying, using the separate profiles, one or more features, generating a training dataset by reducing the one or more features based on a mean-comparison technique, a minority scaling technique, or both, generating a trained machine learning model using the training dataset including the one or more reduced features as labeled input and one or more true lithium plating occurrence statuses as labeled output, and predicting, using the trained machine learning model, an occurrence of lithium plating by inputting subsequently received data into the trained machine learning model.

In another aspect, a tangible, non-transitory computer-readable medium may store instructions and a processing device may execute the instructions to perform one or more operations of any method disclosed herein.

In another aspect, a method may include one or more operations implemented by computer instructions and performed by one or more processing devices to perform the techniques disclosed herein.

Other technical features may be readily apparent to one skilled in the art from the following figures, descriptions, and claims.

Before undertaking the DETAILED DESCRIPTION below, it may be advantageous to set forth definitions of certain words and phrases used throughout this patent document. The term "couple" and its derivatives refer to any direct or indirect communication between two or more elements, independent of whether those elements are in physical contact with one another. The terms "transmit," "receive," and "communicate," as well as derivatives thereof, encompass both direct and indirect communication. The terms "transmit," "receive," and "communicate," as well as derivatives thereof, encompass both communication with remote systems and communication within a system, including reading and writing to different portions of a memory device. The terms "include" and "comprise," as well as derivatives thereof, mean inclusion without limitation. The term "or" is inclusive, meaning or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The term "translate" may refer to any operation performed wherein data is input in one format, representation, language (computer, purpose-specific, such as drug design or integrated circuit design), structure, appearance or other written, oral or representable instantiation and data is output in a different format, representation, language (computer, purpose-specific, such as drug design or integrated circuit design), structure, appearance or other written, oral or representable instantiation, wherein the data output has a similar or identical meaning, semantically or otherwise, to the data input. Translation as a process includes but is not limited to substitution (including macro substitution), encryption, hashing, encoding, decoding or other mathematical or other operations performed on the input data. The same means of translation performed on the same input data will consistently yield the same output data, while a different means of translation performed on the same input data may yield different output data which nevertheless preserves all or part of the meaning or function of the input data, for a given purpose. Notwithstanding the foregoing, in a mathematically degenerate case, a translation can output data identical to the input data. The term "controller" means any device, system or part thereof that controls at least one operation. Such a controller may be implemented in hardware or a combination of hardware and software or firmware. The functionality associated with any particular controller may be centralized or distributed, whether locally or remotely. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

Moreover, various functions described below can be implemented or supported by one or more computer programs, each of which is formed from computer readable program code and embodied in a computer readable storage medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable storage medium" includes any type of medium capable of being accessed by a computer, such as read only memory (ROM), random access memory (RAM), a hard disk drive, a compact disc (CD), a digital video disc (DVD), solid state drive (SSD), or any other type of memory. A "non-transitory" computer readable storage medium excludes wired, wireless, optical, or other communication links that transport transitory electrical or other signals. A non-transitory computer readable storage medium includes media where data can be permanently stored and media where data can be stored and later overwritten, such as a rewritable optical disc or an erasable memory device.

Definitions for other certain words and phrases are provided throughout this patent document. Those of ordinary skill in the art should understand that in many if not most instances, such definitions apply to prior as well as future uses of such defined words and phrases.

BRIEF DESCRIPTION OF THE DRAWINGS

For a more complete understanding of this disclosure and its advantages, reference is now made to the following description, taken in conjunction with the accompanying drawings, in which:

FIG. 7 illustrates example sensor measurement data according to certain embodiments of this disclosure;

DETAILED DESCRIPTION

Figure 1:
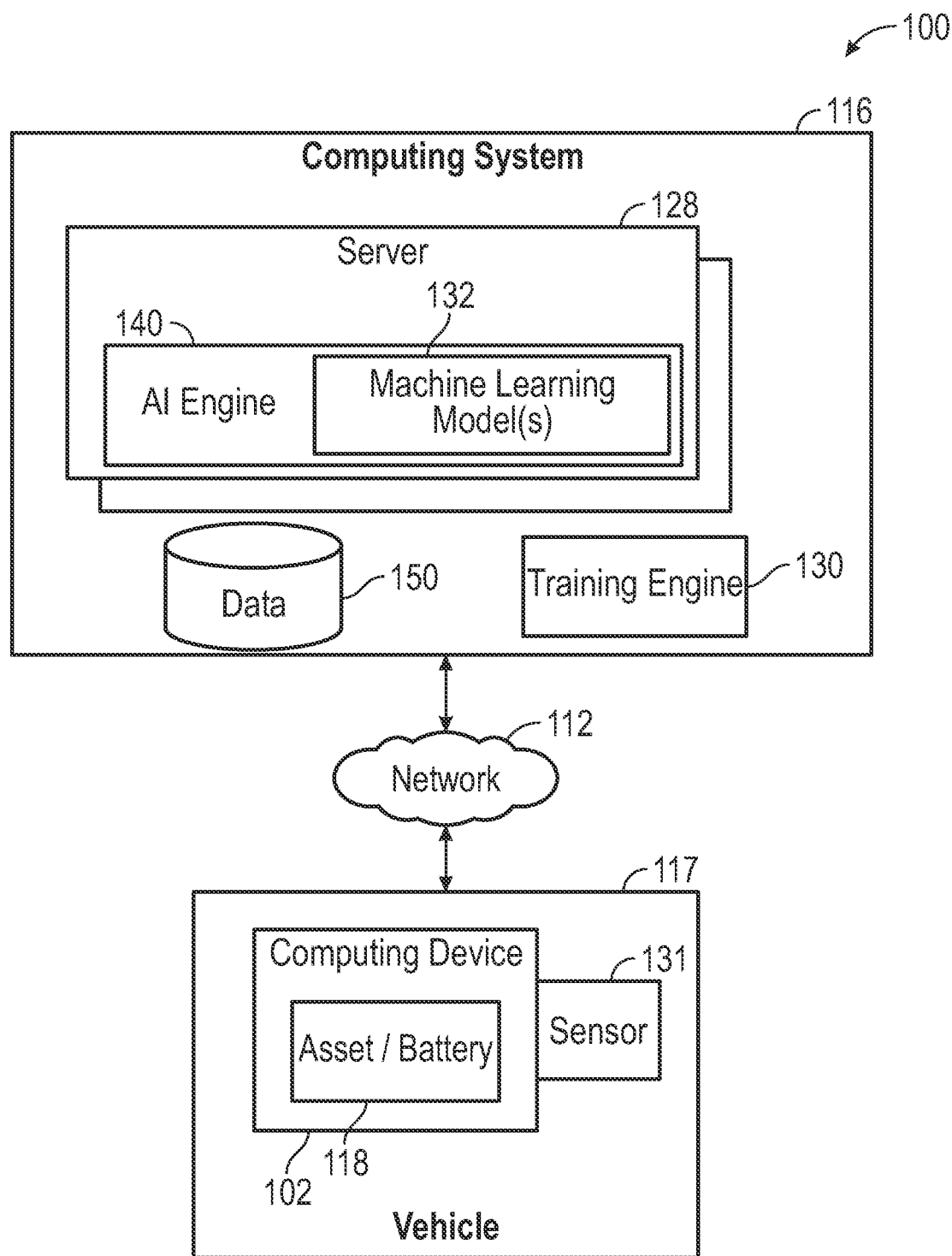
FIG. 1 illustrates a high-level component diagram of an illustrative system architecture according to certain embodiments of this disclosure.

Under ideal conditions, the charge-transfer process of Li-ion batteries may include three steps: (i) de-solvation of solvated Li+ ions (Li+ ions lies within a solution, in order to change location, they separate from the solution and penetrate the Solid Electrolyte Interphase (SEI) as a particle, (ii) Li+ ions pass through the SEI, and (iii) solid-state lithium diffuses into graphite particles. At high charging C rate, Li+ ions move fast and a large amount of Li+ ions may accumulate at the electrode interface due to the slow lithium solid diffusion, and lithium plating occurs.

Lithium plating may be determined by tearing down the battery and applying visual inspection on the internal structure of the cell. The deposited lithium may be visible as a thin layer of metallic lithium on the surface of the negative electrode. Another way to detect lithium plating is to use a specialized instrument referred to as a scanning electron microscope. This instrument may produce high-resolution images of the battery's internal structure, allowing the deposited lithium to be seen on the surface of the negative electrode.

A battery pack may consist of different cell modules which include several number of battery cells. The cell modules may be tightly packed such that it is very difficult to individually replace. In some embodiments of the present disclosure, one or more robots may be used to replace faulty or suspicious cell modules including one or more battery cells. In some embodiments, the individual battery cells may be replaced. For example, a fault or suspicious cell may be detected using the disclosed techniques, a driver may drive a vehicle into a service center, the suspected cell may be replaced with a new cell, and the driver may drive the vehicle away. The suspected cell may be sent to a lab for analysis. The lab may determine whether the suspected cell represents a false positive or true positive and the findings may be used as fleet data, which may be used to further train one or more machine learning models to classify lithium plating on battery packs.

In some embodiments, the disclosed subject matter provides a technical solution to a technical problem of detecting lithium plating that occurs with one or more batteries. Some embodiments may use a supervised learning method as a technical solution to the lithium plating detection problem. The proposed solution may be applied to different kinds of batteries, whether they are big or small, such as smartphones or electric vehicle batteries. The disclosed embodiments may be applicable to full batter pack replacement and/or individual battery cell replacement. Total replacement of a battery pack may be very expensive and may be undesirable to a manufacturer. Thus, the disclosed techniques may enable diagnosing battery cells individually within a battery pack and may enable replacing those individually diagnosed cells and/or changing those individually diagnosed cells.

One goal of the disclosed embodiments is to detect lithium plating prior to an undesired event occurring (e.g., short circuit). In some embodiments, when lithium plating occurs, one or more preventative actions may be performed. For example, a processing device may transmit a message to a computing device of a driver to warn the driver to replace the battery cell and/or battery pack when lithium plating is detected. Further, fleet data may be used to improve the accuracy of the proposed embodiments for detecting lithium plating on a particular vehicle.

In some embodiments, due to reasons such as small differences in manufacturing, cell placement in battery packs, etc. the battery cells in the same battery pack may exhibit different characteristics. As such, an ideal reference battery cell may not be feasible in some instances. In some embodiments, the battery cells may be compared with their neighbors in a battery pack rather than a reference cell. Comparing cells with neighboring cells may be beneficial because battery packs and battery cells may each include many variations. Comparing neighboring cells may provide a more accurate and efficient indication of degradation in some instances. In some embodiments, the battery cells may be compared with a reference cell.

FIGS. 1 through 13, discussed below, and the various embodiments used to describe the principles of this disclosure are by way of illustration only and should not be construed in any way to limit the scope of the disclosure.

FIG. 1 illustrates a high-level component diagram of an illustrative system architecture 100 according to certain embodiments of this disclosure. In some embodiments, the system architecture 100 may include a cloud-based computing system 116, a computing device 102, and a vehicle 117 communicatively coupled via a network 112. The cloud-based computing system 116 may be a real-time software platform, include privacy software or protocols, or include security software or protocols. Each of the computing device 102 and components included in the cloud-based computing system 116 may include one or more processing devices, memory devices, or network interface cards. The network interface cards may enable communication via a wireless protocol for transmitting data over short distances, such as Bluetooth, ZigBee, NFC, etc. Additionally, the network interface cards may enable communicating data via a wired protocol over short or long distances, and in one example, the computing device 102 and/or the cloud-based computing system 116 may communicate with the network 112. Network 112 may be a public network (e.g., connected to the Internet via wired (Ethernet) or wireless (WiFi)), a private network (e.g., a local area network (LAN) or wide area network (WAN)), or a combination thereof. In some embodiments, network 112 may also comprise a node or nodes on the Internet of Things (IoT).

The computing device 102 may be any suitable computing device, such as an embedded computer device with display, a laptop, tablet, smartphone, or computer. The computing device 102 may be included within a vehicle, such as an electric vehicle. The computing device 102 may include a display capable of presenting a user interface of an application. The application may be implemented in computer instructions stored on the one or more memory devices of the computing device 102 and executable by the one or more processing devices of the computing device 102. The computing device may include an asset and/or battery pack 118 pack, each of which may have a useful life that degrades over time. The asset and/or battery pack 118 may be used to charge and power a vehicle (e.g., electric vehicle), smartphone, appliance, or any suitable device that uses a battery.

The user interface may present various screens to a user that present various views including notifications of when lithium plating is detected for one or more battery cells and/or one or more battery packs. The user interface may enable performing a preventive action such as presenting a signal (e.g., warning signal that the lithium plating is present) and/or changing an operating parameter of the vehicle to consume less energy from the battery, and the like. The computing device 102 may also include instructions stored on the one or more memory devices that, when executed by the one or more processing devices of the computing device 102, perform operations of any of the methods described herein.

The vehicle 117 may be any suitable type of vehicle or electric vehicle, such as an automobile, a motorcycle, a boat, an airplane, a bicycle, a scooter, a skateboard, roller skates, roller blades, a unicycle, a surfboard, a drone, or the like. Accordingly, the vehicle may include an engine that is powered by one or more batteries, assets, and motors. The vehicle may also include one or more sensors 131 that are configured to measure any suitable operating parameter of a vehicle, a temperature of the vehicle 117, a vibration of the vehicle 117, a battery pack current, a battery pack cell voltage, a battery pack cell temperature, etc. The sensors 131 may include an accelerometer, a current sensor, a voltage sensor, a temperature sensor, a thermal sensor, a camera, or the like. The processing device of the vehicle 117 may receive the measurements from the one or more sensors 131 and transmit them via the network 112 to the cloud-based computing system 116 for use in training one or more machine learning models 132. In some embodiments, when a machine learning model is trained and ready to process real-time data, the processing device of the vehicle 117 may receive the measurements from the one or more sensors 131 and use them, along with other data (e.g., a user battery usage profile), to predict lithium plating of the battery pack and/or asset 118. The vehicle 117 may also execute an instance of a machine learning model 132 that is trained using parameters received from a cloud-based machine learning model 132.

In some embodiments, the cloud-based computing system 116 may include one or more servers 128 that form a distributed computing system, which may include a cloud computing system. The servers 128 may be a rackmount server, a router, a personal computer, a portable digital assistant, a mobile phone, a laptop computer, a tablet computer, a camera, a video camera, a netbook, a desktop computer, a media center, any other device capable of functioning as a server, or any combination of the above. Each of the servers 128 may include one or more processing devices, memory devices, data storage, or network interface cards. The servers 128 may be in communication with one another via any suitable communication protocol. The servers 128 may execute an artificial intelligence engine 140 and one or more machine learning models 132, as described further herein.

That is, the servers 128 may execute an artificial intelligence (AI) engine 140 that uses one or more machine learning models 132 to perform at least one of the embodiments disclosed herein. The cloud-based computing system 116 may also include a database 150 that stores data, knowledge, and data structures used to perform various embodiments. For example, the database 150 may store fleet of electric vehicles' data, battery data (e.g., original anode thickness, expected cycle loss, etc.) received from a manufacturer of the battery, lab experiment data pertaining to the battery, user battery usage profile, etc. Although depicted separately from the server 128, in some embodiments, the database 150 may be hosted on one or more of the servers 128.

In some embodiments, the cloud-based computing system 116 may include a training engine 130 capable of generating one or more machine learning models 132. Although depicted separately from the AI engine 140, the training engine 130 may, in some embodiments, be included in the AI engine 140 executing on the server 128. In some embodiments, the AI engine 140 may use the training engine 130 to generate the machine learning models 132 trained to perform inferencing and/or predicting operations. The machine learning models 132 may be trained to predict lithium plating occurrence, among other things. The one or more machine learning models 132 may be generated by the training engine 130 and may be implemented in computer instructions executable by one or more processing devices of the training engine 130 or the servers 128. To generate the one or more machine learning models 132, the training engine 130 may train the one or more machine learning models 132. The one or more machine learning models 132 may be used by any of the methods described herein.

The training engine 130 may be a rackmount server, a router, a personal computer, a portable digital assistant, a smartphone, a laptop computer, a tablet computer, a netbook, a desktop computer, an Internet of Things (IoT) device, any other desired computing device, or any combination of the above. The training engine 130 may be cloud-based, be a real-time software platform, include privacy software or protocols, or include security software or protocols.

To generate the one or more machine learning models 132, the training engine 130 may train the one or more machine learning models 132. The training engine 130 may use a base training data set including inputs of labeled data (e.g., assigned a value of 1) associated with lithium plating and labeled data (e.g., assigned a value of 0) not associated with lithium plating, among other things. One or more combinations of the inputs may be mapped to an output pertaining to an occurrence of lithium plating of each cell of the battery pack.

The one or more machine learning models 132 may refer to model artifacts created by the training engine 130 using training data that includes training inputs and corresponding target outputs. The training engine 130 may find patterns in the training data wherein such patterns map the training input to the target output and generate the machine learning models 132 that capture these patterns. Although depicted separately from the server 128, in some embodiments, the training engine 130 may reside on server 128. Further, in some embodiments, the artificial intelligence engine 140, the database 150, or the training engine 130 may reside on the computing device 102.

As described in more detail below, the one or more machine learning models 132 may comprise, e.g., a single level of linear or non-linear operations (e.g., a support vector machine (SVM) or the machine learning models 132 may be a deep network, i.e., a machine learning model comprising multiple levels of non-linear operations. Examples of deep networks are neural networks, including generative adversarial networks, convolutional neural networks, recurrent neural networks with one or more hidden layers, and fully connected neural networks (e.g., each artificial neuron may transmit its output signal to the input of the remaining neurons, as well as to itself). For example, the machine learning model may include numerous layers or hidden layers that perform calculations (e.g., dot products) using various neurons. In some embodiments, the one or more machine learning models 132 may be trained via supervised learning, unsupervised learning, and/or reinforcement learning.

For example, the machine learning model 132 trained to use causal inference may accept one or more inputs, such as (i) assumptions, (ii) queries, and (iii) data. The machine learning model 132 may be trained to output one or more outputs, such as (i) a decision as to whether a query may be answered, (ii) an objective function (also referred to as an estimand or estimated) that provides an answer to the query for any received data, and (iii) an estimated answer to the query and an estimated uncertainty of the answer, where the estimated answer is based on the data and the objective function, and the estimated uncertainty reflects the quality of data (i.e., a measure which takes into account the degree or salience of incorrect data or missing data). The assumptions may also be referred to as constraints and may be simplified into statements used in the machine learning model 132. The queries may refer to scientific questions for which the answers are desired.

Figure 2:
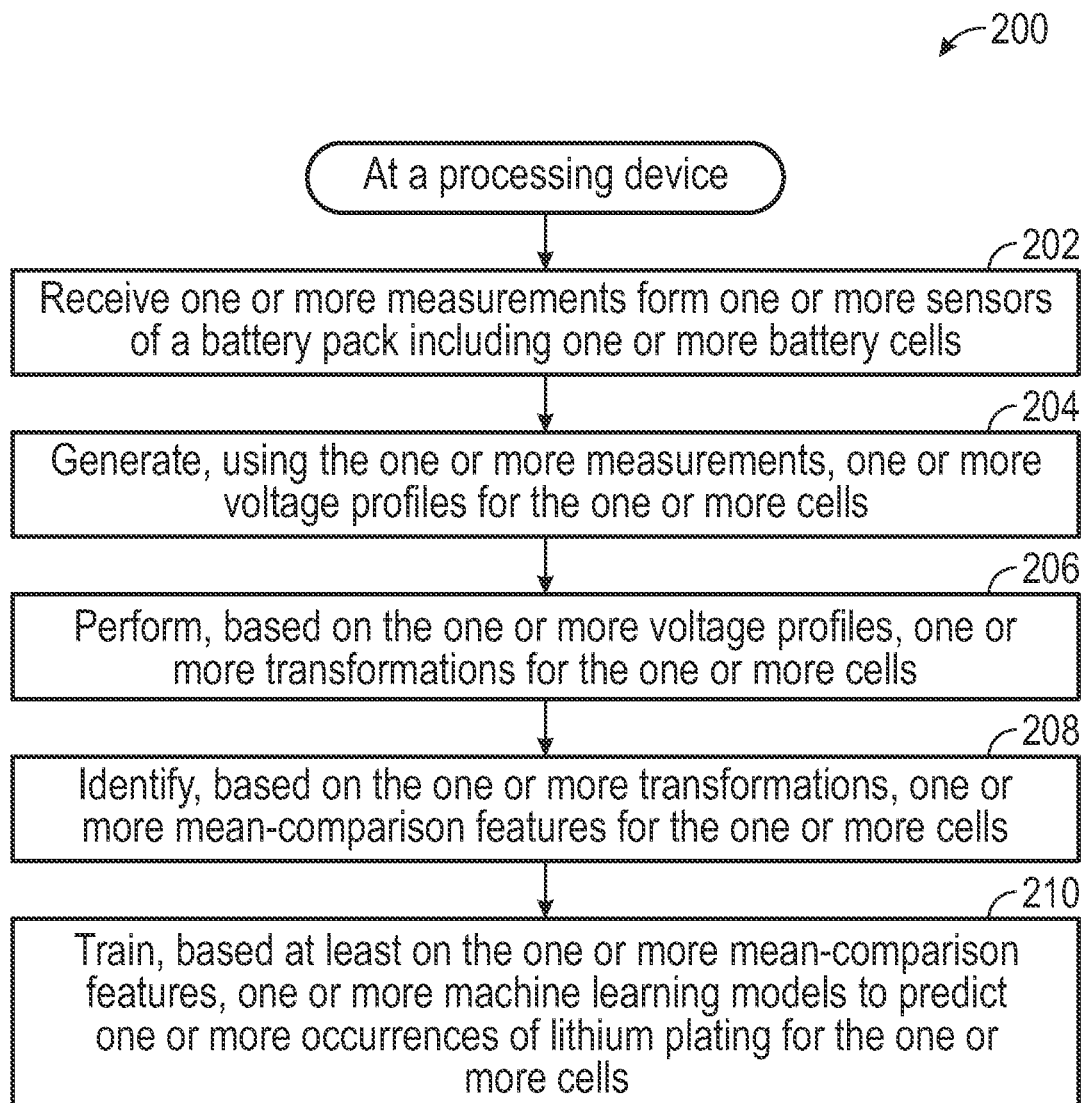
FIG. 2 illustrates example operations of a method for using one or more machine learning models to predict one or more occurrences of lithium plating according to certain embodiments of this disclosure.

FIG. 2 illustrates example operations of a method 200 for using one or more machine learning models to predict one or more occurrences of lithium plating according to certain embodiments of this disclosure. The method 200 is performed by processing logic that may include hardware (circuitry, dedicated logic, etc.), software (such as is run on a computer system or specialized dedicated machine), or a combination of both. The method 200 or each of their individual functions, routines, subroutines, or operations may be performed by one or more processors of a computing device (e.g., any component of FIG. 1, such as server 128 executing the artificial intelligence engine 140). In certain implementations, the method 200 may be performed by a single processing thread. Alternatively, the method 200 may be performed by two or more processing threads, each thread implementing one or more individual functions, routines, subroutines, or operations of the methods. In some embodiments, one or more accelerators may be used to increase the performance of a processing device by offloading various functions, routines, subroutines, or operations from the processing device. One or more operations of the method 200 may be performed by the training engine 130 of FIG. 1.

For simplicity of explanation, the method 200 is depicted and described as a series of operations. However, operations in accordance with this disclosure can occur in various orders or concurrently, and with other operations not presented and described herein. For example, the operations depicted in the method 200 may occur in combination with any other operation of any other method disclosed herein. Furthermore, not all illustrated operations may be required to implement the method 200 in accordance with the disclosed subject matter. In addition, those skilled in the art will understand and appreciate that the method 200 could alternatively be represented as a series of interrelated states via a state diagram or events.

In some embodiments, one or more machine learning models may be generated and trained by the artificial intelligence engine and/or the training engine to perform one or more of the operations of the methods described herein. For example, to perform the one or more operations, the processing device may execute the one or more machine learning models. In some embodiments, the one or more machine learning models may be iteratively retrained to select different features capable of enabling optimization of output. The features that may be modified may include a number of nodes included in each layer of the machine learning models, an objective function executed at each node, a number of layers, various weights associated with outputs of each node, and the like.

At 202, the processing device may receive one or more measurements from one or more sensors of a battery pack including one or more cells. In some embodiments, the battery pack may be used to at least partially power a vehicle, a computing device, or both.

At 204, the processing device may generate, using the one or more measurements, one or more voltage profiles for the one or more cells.

At 206, the processing device may perform, based on the one or more voltage profiles, one or more transformations for the one or more cells. In some embodiments, the one or more transformations may include Fast Fourier Transforms.

At 208, the processing device may identify, based on the one or more transformations, one or more mean-comparison features for the one or more cells.

At 210, the processing device may train, based at least on the one or more mean-comparison features, one or more machine learning models to predict one or more occurrences of lithium plating for the one or more cells. In some embodiments, the processing device may train the one or more machine learning models with one or more time series data labeled as including the lithium plating and one or more time series data labeled as lacking the lithium plating.

In some embodiments, based on the one or more predicted occurrences of lithium plating, the processing device may perform one or more actions. In some embodiments, the one or more actions may include transmitting a notification to a computing device for presentation on the computing device. In some embodiments, the one or more actions may include causing a computing device powered by the battery pack to cease operation. In some embodiments, the one or more actions may include automatically removing, via a robot, the one or more cells predicted to be associated with the one or more occurrences of the lithium plating.

In some embodiments, the processing device may receive one or more subsequent measurements from the one or more sensors, and the processing device may input the one or more subsequent measurements into the one or more machine learning models to predict one or more subsequent occurrences of the lithium plating for the one or more cells.

Figure 3:
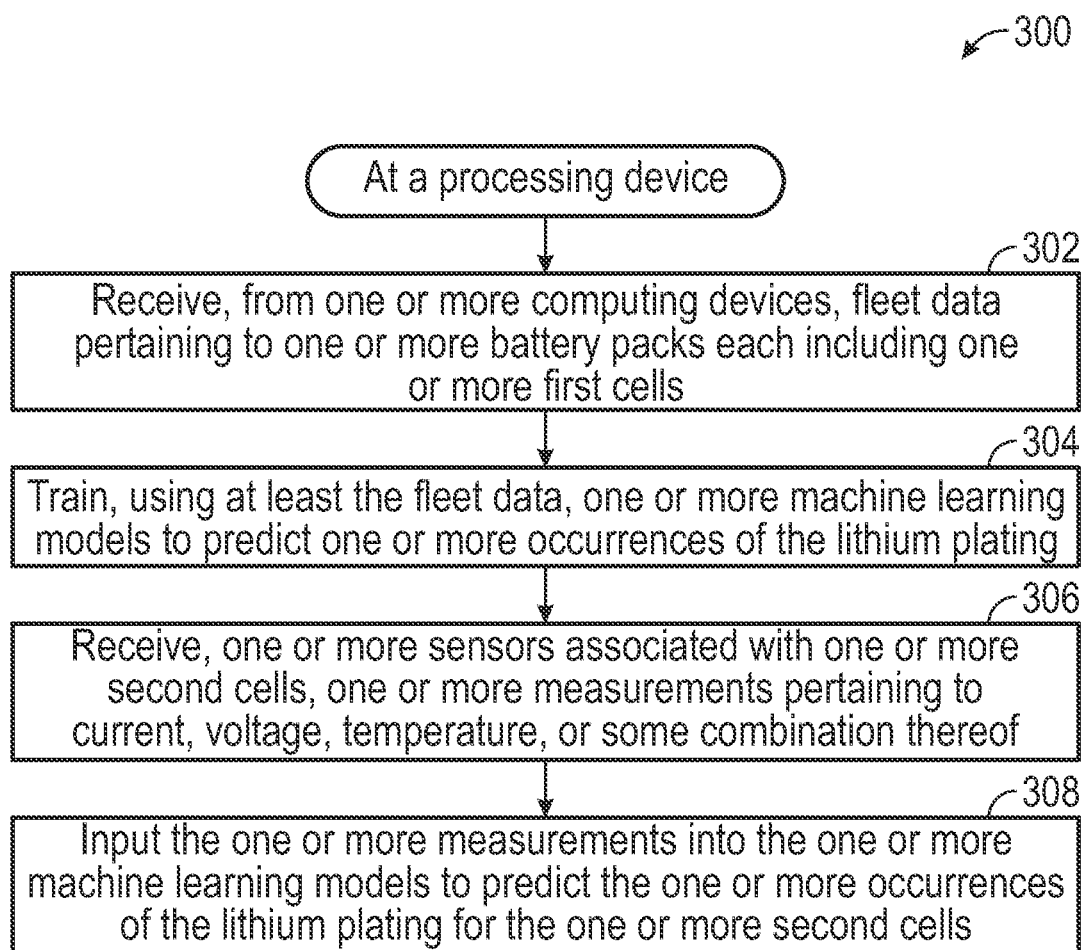
FIG. 3 illustrates example operations of another method for using one or more machine learning models to predict one or more occurrences of lithium plating according to certain embodiments of this disclosure.

FIG. 3 illustrates example operations of another method 300 for using one or more machine learning models to predict one or more occurrences of lithium plating according to certain embodiments of this disclosure. The method 300 is performed by processing logic that may include hardware (circuitry, dedicated logic, etc.), software (such as is run on a computer system or specialized dedicated machine), or a combination of both. The method 300 or each of their individual functions, routines, subroutines, or operations may be performed by one or more processors of a computing device (e.g., any component of FIG. 1, such as server 128 executing the artificial intelligence engine 140, or a processing device of the vehicle 117). In certain implementations, the method 300 may be performed by a single processing thread. Alternatively, the method 300 may be performed by two or more processing threads, each thread implementing one or more individual functions, routines, subroutines, or operations of the methods. In some embodiments, one or more accelerators may be used to increase the performance of a processing device by offloading various functions, routines, subroutines, or operations from the processing device. One or more operations of the method 300 may be performed by the training engine 130 of FIG. 1. The method 300 may be performed in a similar manner as the method 200 of FIG. 2.

At 302, the processing device may receive, from one or more computing devices, fleet data pertaining to one or more battery packs each including one or more first cells. The fleet data may include one or more false positive time series data of lithium plating affecting at least a first cell, one or more true positive time series data of the lithium plating affecting at least a second cell, or both. In some embodiments, the one or more battery packs are used to at least partially power a vehicle, a computing device, or both.

At 304, the processing device may train, using at least the fleet data, one or more machine learning models to predict one or more occurrences of the lithium plating. In some embodiments, the training may be performed via supervised learning.

At 306, the processing device may receive, from one or more sensors associated with one or more second cells, one or more measurements pertaining to current, voltage, temperature, or some combination thereof.

At 308, the processing device may input the one or more measurements into the one or more machine learning models to predict the one or more occurrences of the lithium plating for the one or more second cells.

In some embodiments, based on the one or more predicted occurrences of lithium plating, the processing device may perform one or more actions. In some embodiments, the one or more actions may include transmitting a notification to a computing device for presentation on the computing device. In some embodiments, the one or more actions may include causing a computing device powered by the battery pack to cease operation. In some embodiments, the one or more actions may include automatically removing, via a robot, the one or more cells predicted to be associated with the one or more occurrences of the lithium plating.

Figure 4:
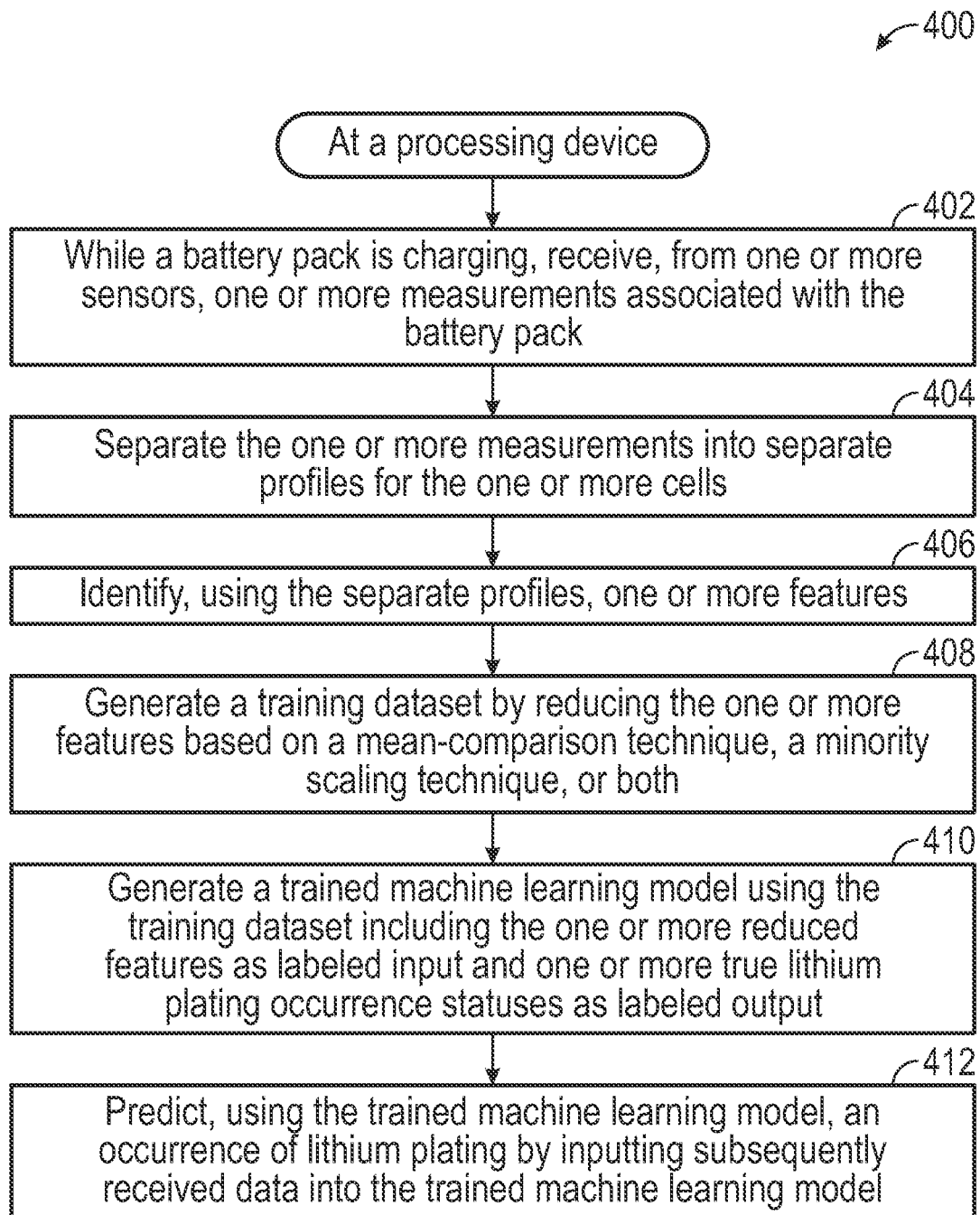
FIG. 4 illustrates example operations of another method for using one or more machine learning models to predict one or more occurrences of lithium plating according to certain embodiments of this disclosure.

FIG. 4 illustrates example operations of another method 400 for using one or more machine learning models to predict one or more occurrences of lithium plating according to certain embodiments of this disclosure. The method 400 is performed by processing logic that may include hardware (circuitry, dedicated logic, etc.), software (such as is run on a computer system or specialized dedicated machine), or a combination of both. The method 400 or each of their individual functions, routines, subroutines, or operations may be performed by one or more processors of a computing device (e.g., any component of FIG. 1, such as server 128 executing the artificial intelligence engine 140). In certain implementations, the method 400 may be performed by a single processing thread. Alternatively, the method 400 may be performed by two or more processing threads, each thread implementing one or more individual functions, routines, subroutines, or operations of the methods. In some embodiments, one or more accelerators may be used to increase the performance of a processing device by offloading various functions, routines, subroutines, or operations from the processing device. One or more operations of the method 400 may be performed by the training engine 130 of FIG. 1. The method 400 may be performed in a similar manner as the method 200 of FIG. 2.

At 402, while a battery pack is charging, the processing device may receive, from one or more sensors, one or more measurements associated with a battery pack. The battery pack may include one or more cells. In some embodiments, the battery pack may be used to at least partially power a vehicle, a computing device, or both.

At 404, the processing device may separate the one or more measurements into separate profiles for the one or more cells. The separate profiles may include data pertaining to current, voltage, temperature, or some combination thereof.

At 406, the processing device may identify, using the separate profiles, one or more features.

At 408, the processing device may generate a trained machine learning model using the training dataset including the one or more reduced features as labeled input and one or more true lithium plating occurrence statuses as labeled output. In some embodiments, the trained machine learning model may be trained via supervised learning.

At 410, the processing device may predict, using the trained machine learning model, an occurrence of lithium plating by inputting subsequently received data into the trained machine learning model.

In some embodiments, based on the one or more predicted occurrences of lithium plating, the processing device may perform one or more actions. In some embodiments, the one or more actions may include transmitting a notification to a computing device for presentation on the computing device. In some embodiments, the one or more actions may include causing a computing device powered by the battery pack to cease operation. In some embodiments, the one or more actions may include automatically removing, via a robot, the one or more cells predicted to be associated with the one or more occurrences of the lithium plating.

Figure 5:
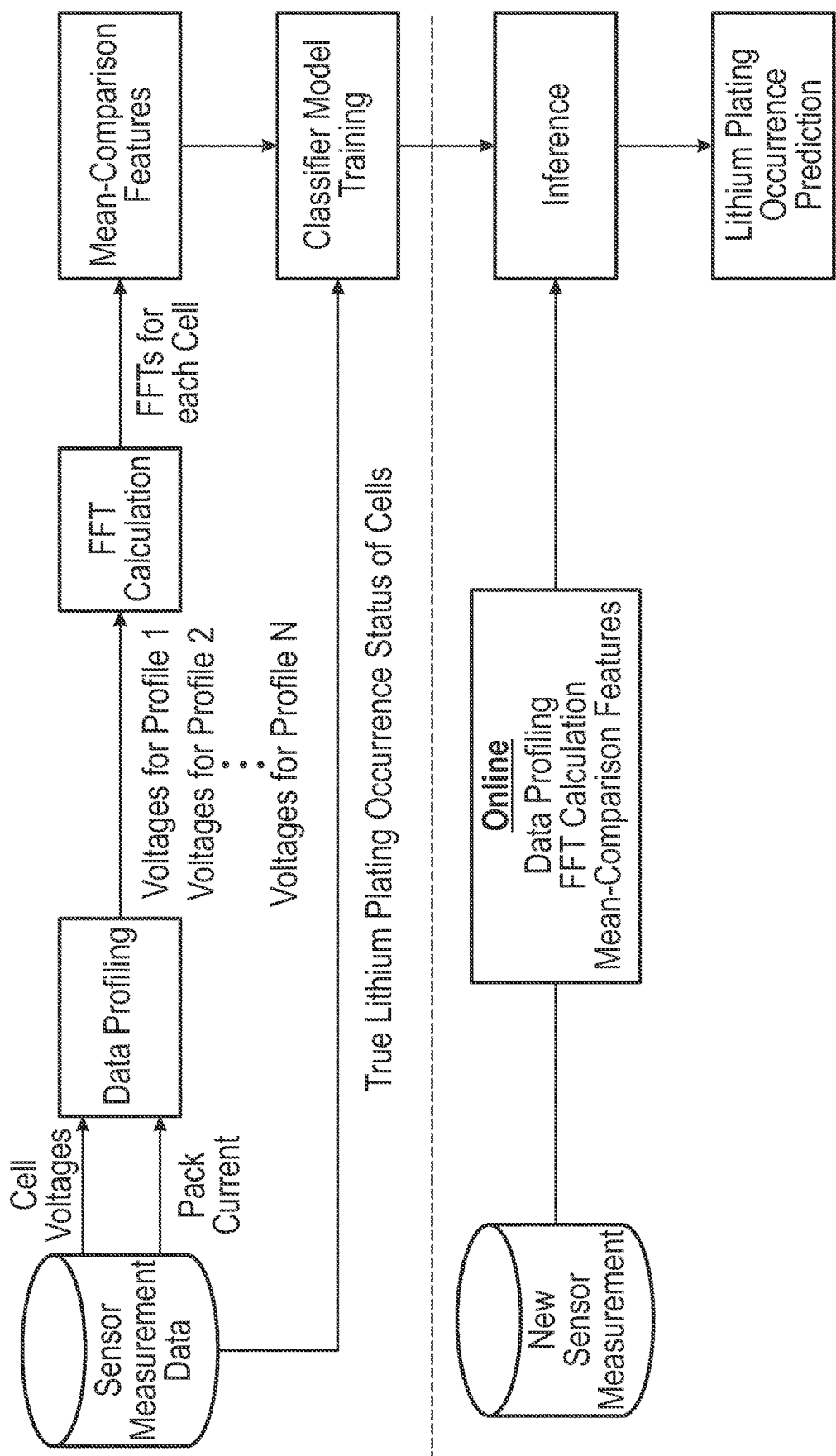
FIG. 5 illustrates an example architecture of using one or more machine learning models to predict lithium plating of an asset according to certain embodiments of this disclosure.

FIG. 5 illustrates an example architecture of using one or more machine learning models to predict lithium plating of an asset or battery (e.g., battery pack and/or cell) according to certain embodiments of this disclosure. As depicted, a database may receive sensor measurement data (e.g., battery current, battery voltage, battery temperature, etc./the sensor measurements received may be associated with each individual battery cell in a battery pack and the battery pack as a whole). The cell voltages and the battery pack current may be used to perform data profiling. Data profiling may result in one or more profiles (e.g., voltage profile 1, voltage profile 2, . . . voltage profile N). The data profiles may be transformed by a processing device of the cloud-based computing system 116. For example, a Fast Fourier Transform may be performed on the data profiles to produce results for each individual cell. The results of the transformed data may be transmitted to a mean-comparison features module that performs a means-comparison features of each cell. The mean-comparison features for each cell may be input to one or more machine learning models for training of a classifier model. Further, during training, true occurrences of lithium plating and the associated data (e.g., current, voltage, temperature, etc.) may be transmitted to the machine learning models 132 for training the classifier model. Once the classifier model is trained, new sensor measurements obtained in real-time (e.g., less than 2 seconds) or near real-time (e.g., 2-10 seconds) eived from the sensors 131 and the cloud-based computing system 116 may perform data profiling, Fast Fourier Transformation, mean-comparison features and input the results into an inference engine including the one or more trained machine learning models (e.g., classifier model). The inference engine may output one or more lithium plating occurrence probabilities for one or more battery cells of the battery pack.

Figure 6:
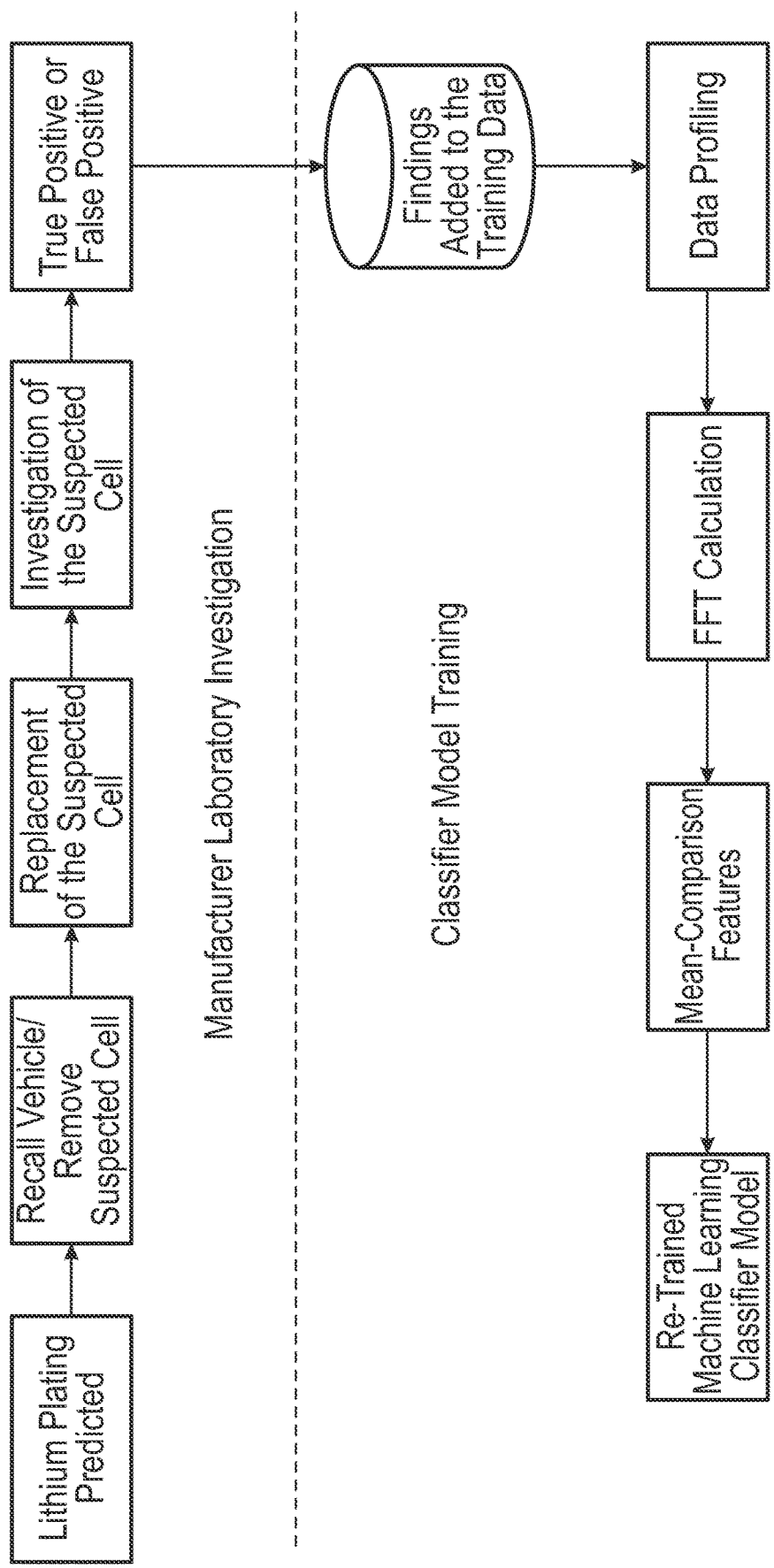
FIG. 6 illustrates an example architecture for using fleet data to train one or more machine learning models to predict lithium plating of an asset according to certain embodiments of this disclosure.

FIG. 6 illustrates an example architecture for using fleet data to train one or more machine learning models to predict lithium plating of an asset according to certain embodiments of this disclosure. The fleet data may include multiple instances of battery current usage, battery voltage usage, battery temperatures, lithium plating occurrences, and the like. As depicted in FIG. 6, lithium plating may be predicted by the classifier model of the inference engine. A preventative action may be performed, such as recalling the vehicle/removing suspect battery cell. A robot including an actuated arm, a processing device, a memory device, a network interface card, and the like may replace the one or more battery cells suspected of experiencing lithium plating. The suspected battery cell may be investigated, for example, using a scanning electron microscope, a processing device, etc. to determine whether lithium plating occurred or did not occur.

The findings that are added to the database 150 may be data profiled, transformed, and means-comparison featured. The results of the means-comparison features may be used retrain the classifier model as fleet data.

FIG. 7 illustrates example sensor measurement data according to certain embodiments of this disclosure. The sensor measurement data depicts time at which the measurements were taken, current, cell and voltage for each cell. It should be noted that the temperature of each cell may also be measured by the sensors 131 and may be used to predict the occurrence of lithium plating.

Figure 8:
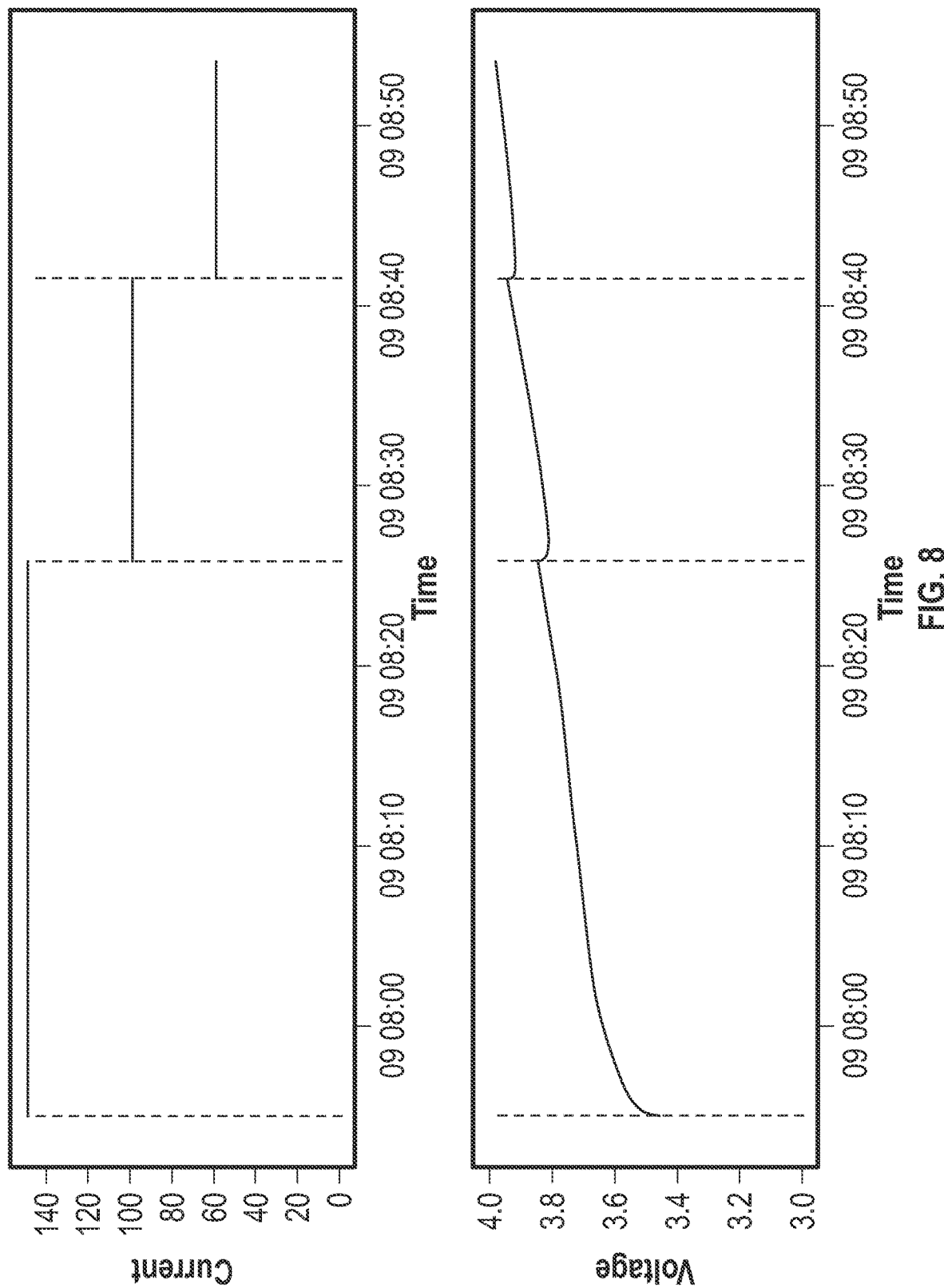
FIG. 8 illustrates example data profiles according to certain embodiments of this disclosure.

FIG. 8 illustrates example data profiles according to certain embodiments of this disclosure. As depicted, there are two charts, one for current and one for voltage. The battery data is extracted during charging, in some embodiments. In some embodiments, the battery data is extracted during discharging of the battery. Multi-step constant current charging method may refer to charging of electric vehicle battery packs with multi-step constant currents in much shorter time, with longer cycle life, and higher energy efficiency compared to two-step constant-current charging. In some embodiments, voltage values that belong to different charging currents may be extracted. In some embodiments, the disclosed techniques may apply to both constant current constant voltage (CCCV) and multi-stage CCCV (constant current constant voltage) charging methods.

As depicted, the sensor measurement data is separated into separate profiles using the current value at that time. Then the voltage values during each current profile is extracted and used for the Fast Fourier Transformation.

Figure 9:
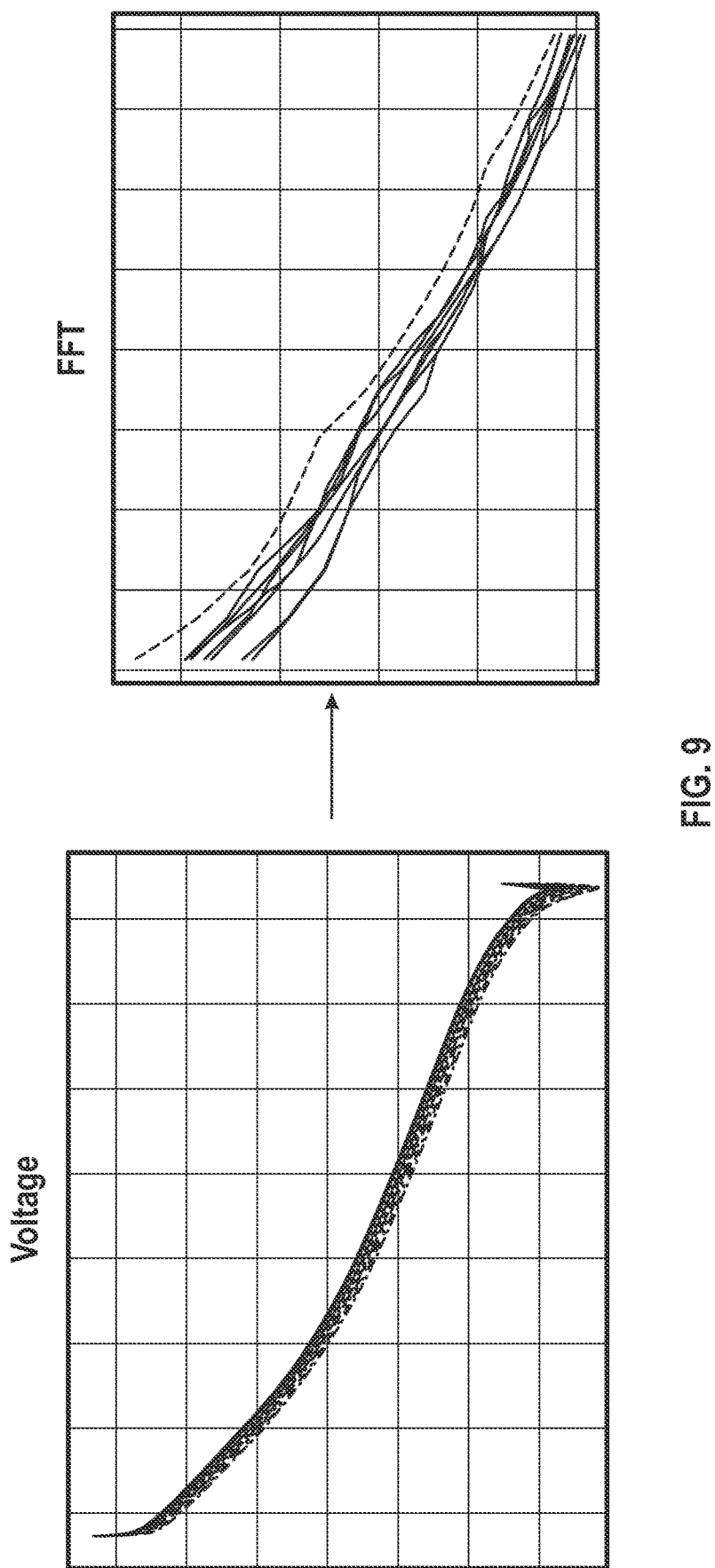
FIG. 9 illustrates example Fast Fourier Transformations according to certain embodiments of this disclosure.

FIG. 9 illustrates example Fast Fourier Transformations according to certain embodiments of this disclosure. The voltage profile may be used to perform the Fast Fourier Transformation (FFT), as depicted. An example of extracted profile can be seen above for the voltage. The FFT is applied to the voltage data to convert time domain data to frequency domain data. The extracted frequency domain features may then be used for calculating mean-comparison features for each cell.

In some embodiments, Discrete Fourier Transforms (DFT) may be used since the signals are digital. DFT may transform time domain signal into frequency domain. That is, time series data may be transformed into a frequency domain. DFT may enhance features of a signal as it transforms the signal from times series to frequency. In some instances, when a charging voltage profile is transformed into the frequency domain, features relating to lithium plating may be observable than when left un-transformed. For example, the speed with which voltage rises or increases is a readily observable feature in the frequency domain.

Figure 10:
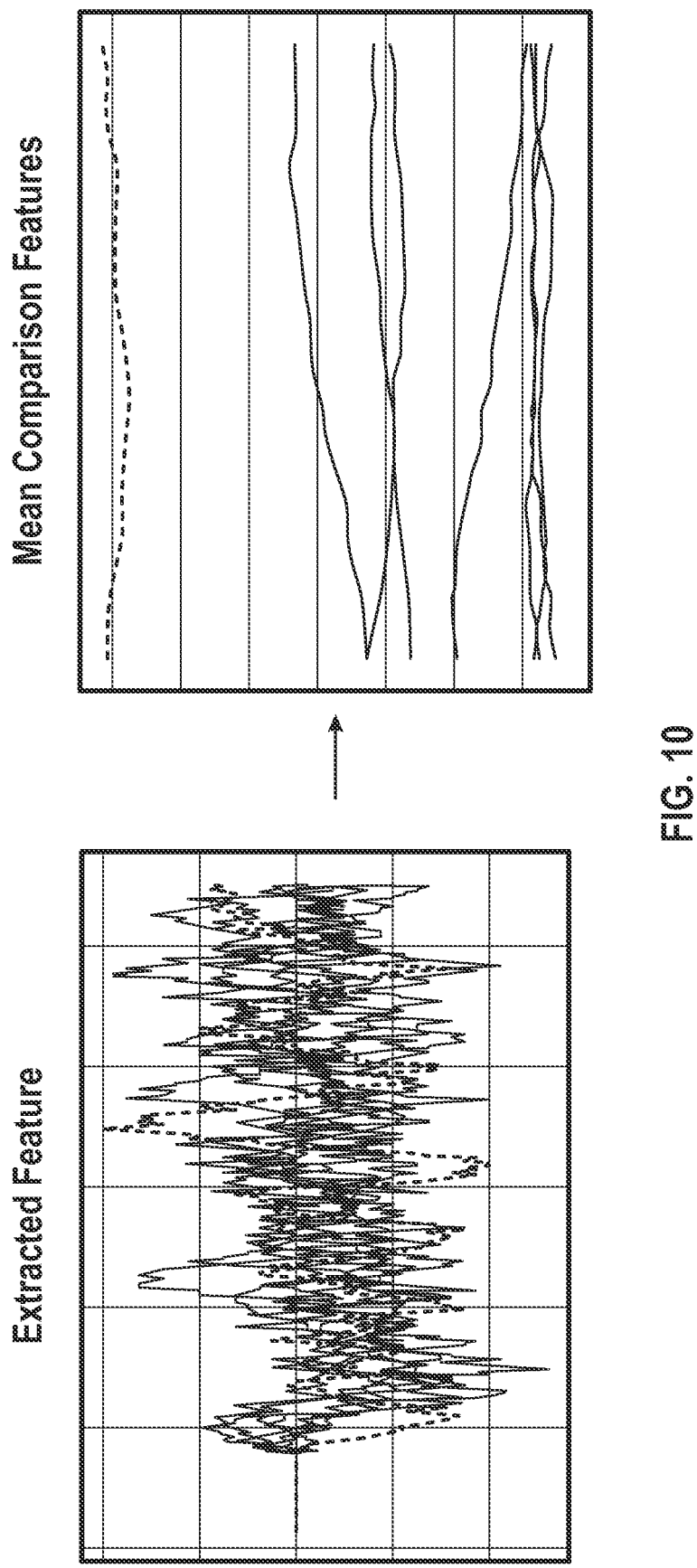
FIG. 10 illustrates example means comparison features according to certain embodiments of this disclosure.

FIG. 10 illustrates example means comparison features according to certain embodiments of this disclosure. The extracted features are depicted on the left of FIG. 10. A mean-comparison feature technique is applied to obtain the features depicted on the right of FIG. 10.

In some embodiments, a Z-score may be performed:

$$z = \frac{x - \mu}{\sigma}$$

x is the raw value, μ is the population mean, and σ is the population standard deviation. As the formula shows, the z-score is simply the raw score minus the population mean, divided by the population standard deviation. Z-scores can be positive or negative. The sign indicates whether the observation is above or below the mean. For example, "speed of charge" feature may be used as a highlighted, selected, or desired feature. This feature may have a raw value of 8μ. Population mean may be calculated by comparing the mean value collected from all neighboring cells, such as 6. σ may be standard deviation calculated from values obtained from neighboring cells, such as 2. So z mean may yield (8−6)/2=1. Feature selection and class imbalance may also be used.

$$r = \frac{x}{\mu}$$

x is the raw value, μ is the population mean. It defines the ratio of a sample to the mean of the set that sample belongs.

$$d = x - \mu$$

x is the raw value, μ is the population mean. It defines the difference between a sample and the mean of the set that sample belongs.

The architecture may generate numerous (e.g., over 1,000) features, which is a combination of the features mentioned previously. Feeding all of those features to a trained machine learning model may be inefficient and may degrade model performance. A technical solution is to reduce the feature set. For example, SHAP (SHapley Additive exPlanations) is a game theoretic approach to explain the output of any machine learning model. It connects optimal credit allocation with local explanations using the classic Shapley values from game theory and their related extensions. Along with SHAP, RFE (Recursive Feature Selection) may be used to eliminate features that have lower importance. The goal of recursive feature elimination (RFE) is to select features by recursively considering smaller and smaller sets of features. As a result, ~1,000 features may be reduced to ~50 features, and those features are used in training. Accordingly, one or more orders of magnitude may be reduced to reduce the computing resources consumed during training. This technical solution may provide a technical improvement to the process of predicting lithium plating.

Further, in some embodiments, minority scaling may be performed. Minority scaling may be used to balance the positive and negative classes in a dataset. It may be used when training a model for a classification problem that has an imbalanced dataset, where the ratio of negative to positive samples is skewed. Minority scaling can help the model to make better predictions on the minority class, as it gives more weight to the minority class during training. The weight of the samples containing lithium plating may be adjusted according to their occurrence rate in the data.

Figure 11:
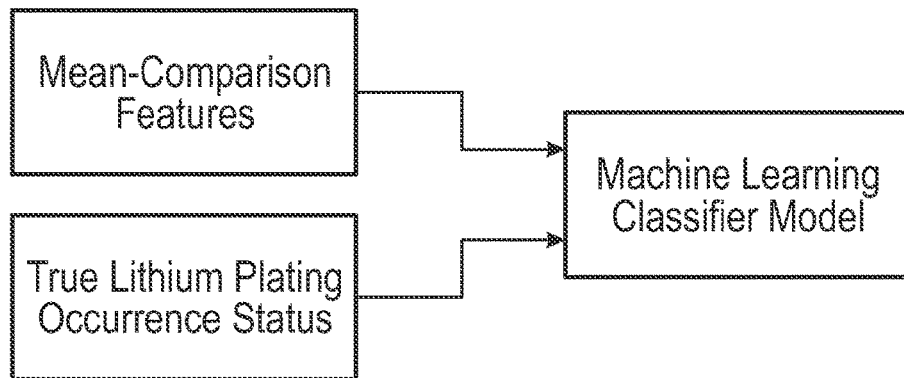
FIG. 11 illustrates an example of training a classifier machine learning model according to certain embodiments of this disclosure.

FIG. 11 illustrates an example of training a classifier machine learning model according to certain embodiments of this disclosure. The classifier machine learning model may be one of the trained machine learning models 132 described herein. The machine learning classifier model may be trained with mean-comparison features as input and true lithium plating occurrence statuses as reference outputs. That is, the true lithium plating occurrence may be labeled data obtained from a manufacturer lab investigation, or the like.

Figure 12:
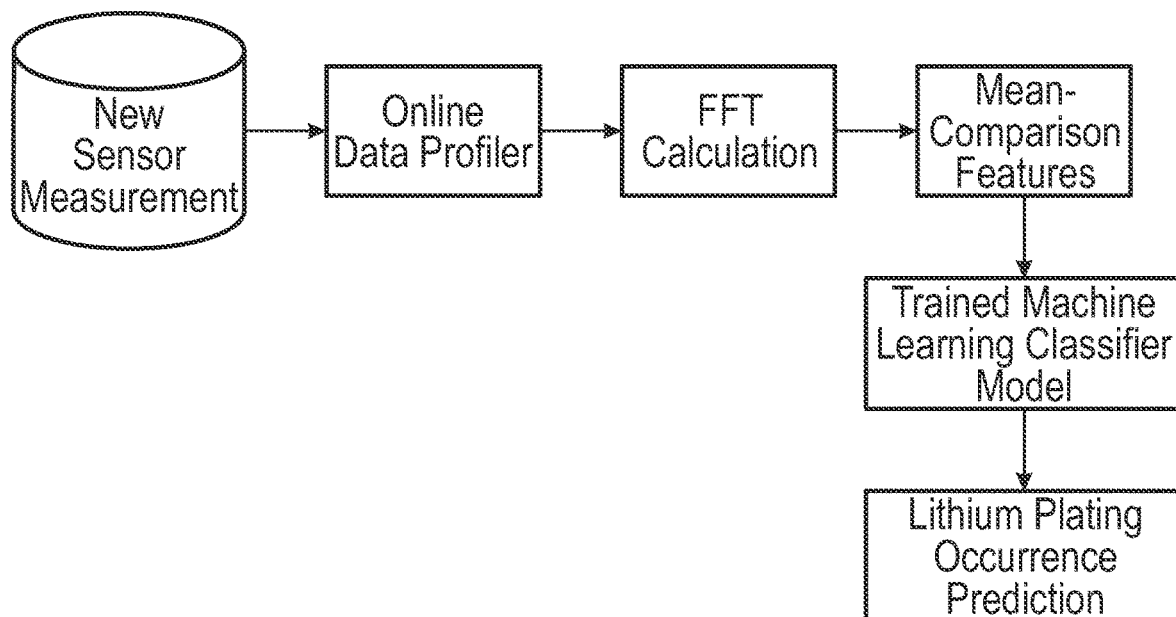
FIG. 12 illustrates an example pipeline for performing inference using one or more trained machine learning models according to certain embodiments of this disclosure.

FIG. 12 illustrates an example pipeline for performing inference using one or more trained machine learning models according to certain embodiments of this disclosure. As depicted, the online data profiler may wait for a current usage profile to end to create a start-to-finish profile snippet from a live-stream. The online data profiler may determine one or more voltage profiles for each cell of a battery pack. The online data profiler may run in an iterative manner with being executed on each new sensor reading. A clipped profile may be fed as input to the FFT calculator. The FFT result for each cell may be fed as input to the mean-comparison features module. The result of the mean-comparison features may be input to the trained machine learning classifier model, which predicts an occurrence of lithium plating for each cell.

During stepped charging, when a certain level of current is applied to a battery, the battery's voltage may not immediately reach its top value but may rise from a lower level voltage value to a higher voltage level in time. For example, 150 ampers may be applied to the battery and the battery's voltage may start at 3.4V at time T and dim to 3.8V at time T+dT. The data profiler may obtain data during this time and transmits the data as a time series. The data profiler may similarly obtain current and temperature data during this time and other times as a time series. Time series data transmitted from data profiler may be represented as 3.4V–T, 3.8V–T+dT, 4.0V–T+2dT. The time series data may be input into the one or more machine learning models as training data during training to train the one or more machine learning models to output a prediction of lithium plating occurrence. That is, the training data may include labeled time series data associated with true positive lithium plating and/or false positive lithium plating examples.

Figure 13:
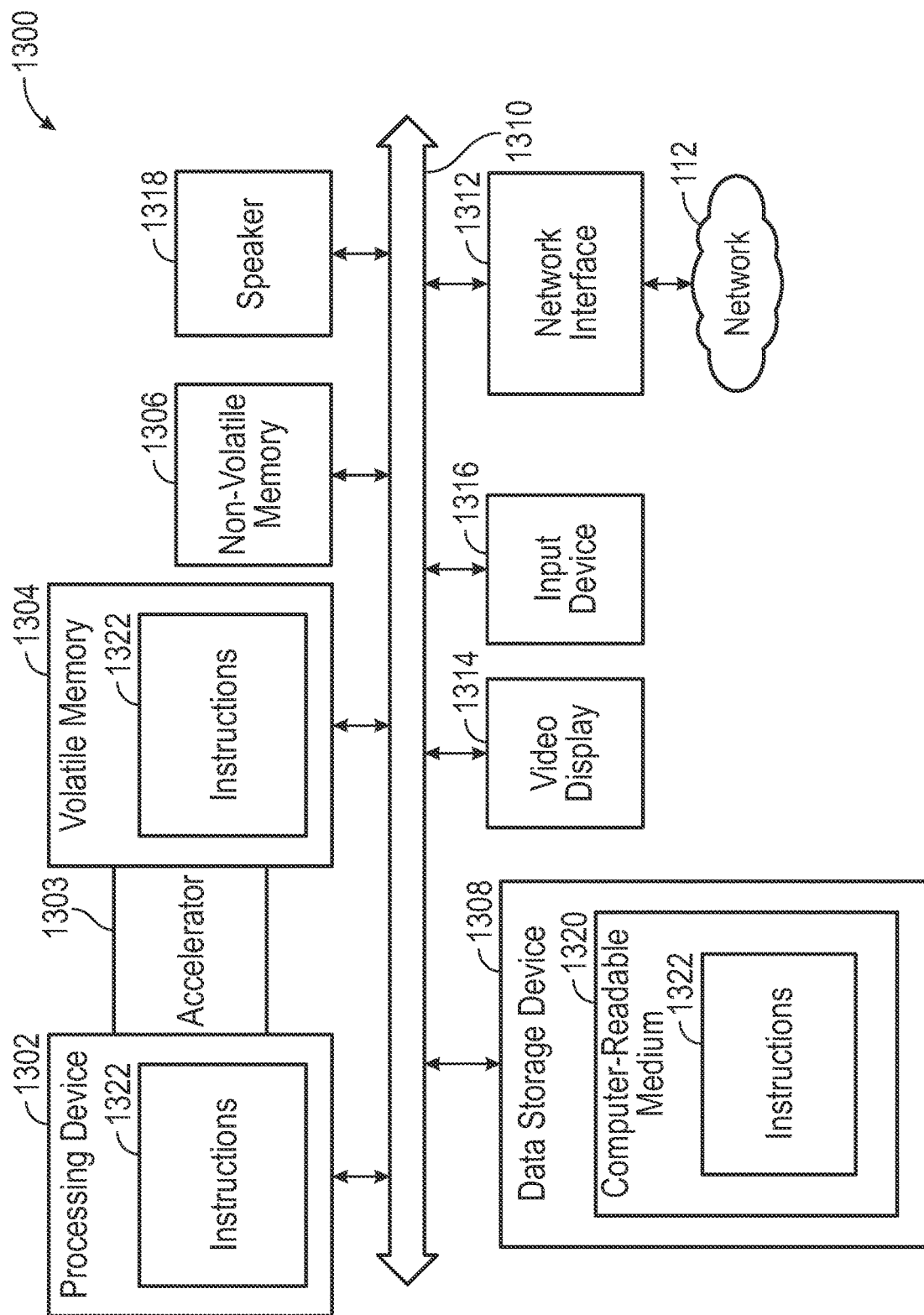
FIG. 13 illustrates an example computer system according to certain embodiments of this disclosure.

FIG. 13 illustrates example computer system 1300 which can perform any one or more of the methods described herein, in accordance with one or more aspects of the present disclosure. In one example, computer system 1300 may correspond to the computing device 102 (e.g., user computing device), computing device 103, one or more servers 128 of the cloud-based computing system 116, the training engine 130, any component of the vehicle 117, or any suitable component of FIG. 1. The computer system 1300 may be capable of executing the one or more machine learning models 132 of FIG. 1. The computer system may be connected (e.g., networked) to other computer systems in a LAN, an intranet, an extranet, or the Internet. The computer system may operate in the capacity of a server in a client-server network environment. The computer system may be a personal computer (PC), a tablet computer, a wearable (e.g., wristband), a set-top box (STB), a personal Digital Assistant (PDA), a mobile phone, a camera, a video camera, or any device capable of executing a set of instructions (sequential or otherwise) that specify actions to be taken by that device. Further, while only a single computer system is illustrated, the term "computer" shall also be taken to include any collection of computers that individually or jointly execute a set (or multiple sets) of instructions to perform any one or more of the methods discussed herein.

The computer system 1300 includes a processing device 1302, a volatile memory 1304 (e.g., random access memory (RAM)), a non-volatile memory 1306 (e.g., read-only memory (ROM), flash memory, solid state drives (SSDs), and a data storage device 1308, the foregoing of which are enabled to communicate with each other via a bus 1310.

Processing device 1302 represents one or more general-purpose processing devices such as a microprocessor, central processing unit, or the like. More particularly, the processing device 1302 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 1302 may also be one or more special-purpose processing devices such as an application specific integrated circuit (ASIC), a system on a chip, a field programmable gate array (FPGA), a digital signal processor (DSP), network processor, or the like. The processing device 1302 may include more than one processing device, and each of the processing devices may be the same or different types. The processing device 1302 may include or be communicatively coupled to one or more accelerators 1303 configured to offload various data-processing tasks from the processing device 1302. The processing device 1302 is configured to execute instructions for performing any of the operations and steps discussed herein.

The computer system 1300 may further include a network interface device 1312. The network interface device 1312 may be configured to communicate data via any suitable communication protocol. In some embodiments, the network interface devices 1312 may enable wireless (e.g., WiFi, Bluetooth, ZigBee, etc.) or wired (e.g., Ethernet, etc.) communications. The computer system 1300 also may include a video display 1314 (e.g., a liquid crystal display (LCD), a light-emitting diode (LED), an organic light-emitting diode (OLED), a quantum LED, a cathode ray tube (CRT), a shadow mask CRT, an aperture grille CRT, or a monochrome CRT), one or more input devices 1316 (e.g., a keyboard or a mouse), and one or more speakers 1318 (e.g., a speaker). In one illustrative example, the video display 1314 and the input device(s) 1316 may be combined into a single component or device (e.g., an LCD touch screen).

The output device 1350 may transmit and receive data from a computer system application programming interface (API). The data may pertain to any suitable information described herein, such as a remaining useful life of a battery pack, among other information.

The data storage device 1308 may include a computer-readable medium 1320 on which the instructions 1322 embodying any one or more of the methods, operations, or functions described herein is stored. The instructions 1322 may also reside, completely or at least partially, within the volatile memory 1304 or within the processing device 1302 during execution thereof by the computer system 1300. As such, the volatile memory 1304 and the processing device 1302 also constitute computer-readable media. The instructions 1322 may further be transmitted or received over a network via the network interface device 1312.

While the computer-readable storage medium 1320 is shown in the illustrative examples to be a single medium, the term "computer-readable storage medium" should be taken to include a single medium or multiple media (e.g., a centralized or distributed database, or associated caches and servers) that store the one or more sets of instructions. The term "computer-readable storage medium" shall also be taken to include any medium capable of storing, encoding, or carrying a set of instructions for execution by the machine, where such set of instructions cause the machine to perform any one or more of the methodologies of the present disclosure. The term "computer-readable storage medium" shall accordingly be taken to include, but not be limited to, solid-state memories, optical media, and magnetic media.

None of the description in this application should be read as implying that any particular element, step, or function is an essential element that must be included in the claim scope. The scope of patented subject matter is defined only by the claims. Moreover, none of the claims is intended to invoke 35 U.S.C. § 112(f) unless the exact words "means for" are followed by a participle.

Consistent with the above disclosure, the examples of systems and method enumerated in the following clauses are specifically contemplated and are intended as a non-limiting set of examples.

1. A computer-implemented method comprising:
   receiving one or more measurements from one or more sensors of a battery pack comprising one or more cells;
   generating, using the one or more measurements, one or more voltage profiles for the one or more cells;
   performing, based on the one or more voltage profiles, one or more transformations for the one or more cells;
   identifying, based on the one or more transformations, one or more mean-comparison features for the one or more cells; and
   training, based at least on the one or more mean-comparison features, one or more machine learning models to predict one or more occurrences of lithium plating for the one or more cells.

2. The computer-implemented method of any clause herein, wherein, based on the one or more predicted occurrences of lithium plating, performing one or more actions.

3. The computer-implemented method of claim 2, wherein the one or more actions comprise transmitting a notification to a computing device for presentation on the computing device.

4. The computer-implemented method of any clause herein, wherein the one or more actions comprise causing a computing device powered by the battery pack to cease operation.

5. The computer-implemented method of any clause herein, wherein the one or more transformations comprise fast fourier transforms.

6. The computer-implemented method of any clause herein, further comprising:
   receiving one or more subsequent measurements from the one or more sensors; and
   inputting the one or more subsequent measurements into the one or more machine learning models to predict one or more subsequent occurrences of the lithium plating for the one or more cells.

7. The computer-implemented method of any clause herein, further comprising training the one or more machine learning models with one or more time series data labeled as including the lithium plating and one or more time series data labeled as lacking the lithium plating.

8. The computer-implemented method of any clause herein, wherein the battery pack is used to at least partially power a vehicle, a computing device, or both.

9. The computer-implemented method of any clause herein, wherein the one or more actions comprise automatically removing, via a robot, the one or more cells predicted to be associated with the one or more occurrences of the lithium plating.

10. A tangible, non-transitory computer-readable medium storing instructions that, when executed, cause a processing device to:
    receive one or more measurements from one or more sensors of a battery pack comprising one or more battery cells;
    generate, using the one or more measurements, one or more voltage profiles for the one or more cells;
    perform, based on the one or more voltage profiles, one or more transformations for the one or more cells;
    identify, based on the one or more transformations, one or more mean-comparison features for the one or more cells; and
    train, based at least on the one or more mean-comparison features, one or more machine learning models to predict one or more occurrences of lithium plating for the one or more cells.

11. The computer-readable medium of any clause herein, wherein, based on the one or more predicted occurrences of lithium plating, the processing device performs one or more actions.

12. The computer-readable medium of any clause herein, wherein the one or more actions comprise transmitting a notification to a computing device for presentation on the computing device.

13. The computer-readable medium of any clause herein, wherein the one or more actions comprise causing a computing device powered by the battery pack to cease operation.

14. The computer-readable medium of any clause herein, wherein the one or more transformations comprise fast fourier transforms.

15. The computer-readable medium of any clause herein, wherein the processing device:
    receives one or more subsequent measurements from the one or more sensors; and
    inputs the one or more subsequent measurements into the one or more machine learning models to predict one or more subsequent occurrences of the lithium plating for the one or more cells.

16. The computer-readable medium of any clause herein, further comprising training the one or more machine learning models with one or more time series data labeled as including the lithium plating and one or more time series data labeled as lacking the lithium plating.

17. The computer-readable medium of any clause herein, wherein the battery pack is used to at least partially power a vehicle, a computing device, or both.

18. The computer-readable medium of any clause herein, wherein the one or more actions comprise automatically removing, via a robot, the one or more cells predicted to be associated with the one or more occurrences of the lithium plating.

19. A system comprising:
    a memory device storing instructions;
    a processing device communicatively coupled to the memory device, wherein the processing device executes the instructions to:
    receive one or more measurements from one or more sensors of a battery pack comprising one or more battery cells;
    generate, using the one or more measurements, one or more voltage profiles for the one or more cells;
    perform, based on the one or more voltage profiles, one or more transformations for the one or more cells;
    identify, based on the one or more transformations, one or more mean-comparison features for the one or more cells; and
    train, based at least on the one or more mean-comparison features, one or more machine learning models to predict one or more occurrences of lithium plating for the one or more cells.

20. The system of any clause herein, wherein, based on the one or more predicted occurrences of lithium plating, the processing device performs one or more actions.

21. A computer-implemented method comprising:
    receiving, from one or more computing devices, fleet data pertaining to one or more battery packs each comprising one or more first cells, wherein the fleet data comprises one or more false positive time series data of lithium plating affecting at least a first cell, one or more true positive time series data of the lithium plating affecting at least a second cell, or both;

training, using at least the fleet data, one or more machine learning models to predict one or more occurrences of the lithium plating;

receiving, from one or more sensors associated with one or more second cells, one or more measurements pertaining to current, voltage, temperature, or some combination thereof; and inputting the one or more measurements into the one or more machine learning models to predict the one or more occurrences of the lithium plating for the one or more second cells.

22. The computer-implemented method of any clause herein, based on the one or more predicted occurrences of lithium plating, performing one or more actions.

23. The computer-implemented method of any clause herein, wherein the one or more actions comprise transmitting a notification to a computing device for presentation on the computing device.

24. The computer-implemented method of any clause herein, wherein the one or more actions comprise causing a computing device powered by the battery pack to cease operation.

25. The computer-implemented method of any clause herein, wherein the training is performed via supervised learning.

26. The computer-implemented method of any clause herein, wherein the one or more battery packs are used to at least partially power a vehicle, a computing device, or both.

27. The computer-implemented method of any clause herein, wherein the one or more actions comprise automatically removing, via a robot, the one or more second cells predicted to be associated with the one or more occurrences of the lithium plating.

28. A tangible, non-transitory computer-readable medium storing instructions that, when executed, cause a processing device to:

receive, from one or more computing devices, fleet data pertaining to one or more battery packs each comprising one or more first cells, wherein the fleet data comprises one or more false positive time series data of lithium plating affecting at least a first cell, one or more true positive time series data of the lithium plating affecting at least a second cell, or both;

train, using at least the fleet data, one or more machine learning models to predict one or more occurrences of the lithium plating;

receive, from one or more sensors associated with one or more second cells, one or more measurements pertaining to current, voltage, temperature, or some combination thereof; and input the one or more measurements into the one or more machine learning models to predict the one or more occurrences of the lithium plating for the one or more second cells.

29. The computer-readable medium of any clause herein, wherein, based on the one or more predicted occurrences of lithium plating, the processing device performs one or more actions.

30. The computer-implemented method of any clause herein, wherein the one or more actions comprise transmitting a notification to a computing device for presentation on the computing device.

31. The computer-readable medium of any clause herein, wherein the one or more actions comprise causing a computing device powered by the battery pack to cease operation.

32. The computer-readable medium of any clause herein, wherein the training is performed via supervised learning.

33. The computer-readable medium of any clause herein, wherein the one or more battery packs are used to at least partially power a vehicle, a computing device, or both.

34. The computer-implemented method of any clause herein, wherein the one or more actions comprise automatically removing, via a robot, the one or more second cells predicted to be associated with the one or more occurrences of the lithium plating.

35. A system comprising:

a memory device storing instructions;

a processing device communicatively coupled to the processing device, wherein the processing device executes the instructions to:

receive, from one or more computing devices, fleet data pertaining to one or more battery packs each comprising one or more first cells, wherein the fleet data comprises one or more false positive time series data of lithium plating affecting at least a first cell, one or more true positive time series data of the lithium plating affecting at least a second cell, or both;

train, using at least the fleet data, one or more machine learning models to predict one or more occurrences of the lithium plating;

receive, from one or more sensors associated with one or more second cells, one or more measurements pertaining to current, voltage, temperature, or some combination thereof; and input the one or more measurements into the one or more machine learning models to predict the one or more occurrences of the lithium plating for the one or more second cells.

36. The system of any clause herein, wherein, based on the one or more predicted occurrences of lithium plating, the processing device performs one or more actions.

37. The system of any clause herein, wherein the one or more actions comprise transmitting a notification to a computing device for presentation on the computing device.

38. The system of any clause herein, wherein the one or more actions comprise causing a computing device powered by the battery pack to cease operation.

39. The system of any clause herein, wherein the training is performed via supervised learning.

40. The system of any clause herein, wherein the one or more battery packs are used to at least partially power a vehicle, a computing device, or both.

41. A computer-implemented method comprising:

while a battery pack is charging, receiving, from one or more sensors, one or more measurements associated with the battery pack, wherein the battery pack comprises one or more cells;

separating the one or more measurements into separate profiles for the one or more cells, wherein the separate profiles include data pertaining to current, voltage, temperature, or some combination thereof;

identifying, using the separate profiles, one or more features;

generating a training dataset by reducing the one or more features based on a mean-comparison technique, a minority scaling technique, or both;

generating a trained machine learning model using the training dataset comprising the one or more reduced features as labeled input and one or more true lithium plating occurrence statuses as labeled output; and predicting, using the trained machine learning model, an occurrence of lithium plating by inputting subsequently received data into the trained machine learning model.

42. The computer-implemented method of any clause herein, based on the predicted occurrence of lithium plating, performing one or more actions.

43. The computer-implemented method of any clause herein, wherein the one or more actions comprise transmitting a notification to a computing device for presentation on the computing device.

44. The computer-implemented method of any clause herein, wherein the one or more actions comprise causing a computing device powered by the battery pack to cease operation.

45. The computer-implemented method of any clause herein, wherein the trained machine learning model is trained via supervised learning.

46. The computer-implemented method of any clause herein, wherein the battery pack is used to at least partially power a vehicle, a computing device, or both.

47. The computer-implemented method of any clause herein, wherein the one or more actions comprise automatically removing, via a robot, one or more cells predicted to be associated with the one or more occurrences of the lithium plating.

48. A tangible, non-transitory computer-readable medium storing instructions that, when executed, cause a processing device to:
while a battery pack is charging, receive, from one or more sensors, one or more measurements associated with the battery pack, wherein the battery pack comprises one or more cells;
separate the one or more measurements into separate profiles for the one or more cells, wherein the separate profiles include data pertaining to current, voltage, temperature, or some combination thereof;
identify, using the separate profiles, one or more features;
generate a training dataset by reducing the one or more features based on a mean-comparison technique, a minority scaling technique, or both;
generate a trained machine learning model using the training dataset comprising the one or more reduced features as labeled input and one or more true lithium plating occurrence statuses as labeled output; and
predict, using the trained machine learning model, an occurrence of lithium plating by inputting subsequently received data into the trained machine learning model.

49. The computer-readable medium of any clause herein, wherein, based on the predicted occurrence of lithium plating, the processing device performs one or more actions.

50. The computer-readable medium of any clause herein, wherein the one or more actions comprise transmitting a notification to a computing device for presentation on the computing device.

51. The computer-readable medium of any clause herein, wherein the one or more actions comprise causing a computing device powered by the battery pack to cease operation.

52. The computer-readable medium of any clause herein, wherein the trained machine learning model is trained via supervised learning.

53. The computer-readable medium of any clause herein, wherein the battery pack is used to at least partially power a vehicle, a computing device, or both.

54. The computer-readable medium of claim 9, wherein the one or more actions comprise automatically removing, via a robot, one or more cells predicted to be associated with the one or more occurrences of the lithium plating.

55. A system comprising:
A memory device storing instructions; and
A processing device communicatively coupled to the memory device, wherein the processing device executes the instructions to:
while a battery pack is charging, receive, from one or more sensors, one or more measurements associated with the battery pack, wherein the battery pack comprises one or more cells;
separate the one or more measurements into separate profiles for the one or more cells, wherein the separate profiles include data pertaining to current, voltage, temperature, or some combination thereof;
identify, using the separate profiles, one or more features;
generate a training dataset by reducing the one or more features based on a mean-comparison technique, a minority scaling technique, or both;
generate a trained machine learning model using the training dataset comprising the one or more reduced features as labeled input and one or more true lithium plating occurrence statuses as labeled output; and
predict, using the trained machine learning model, an occurrence of lithium plating by inputting subsequently received data into the trained machine learning model.

56. The system of any clause herein, wherein, based on the predicted occurrence of lithium plating, the processing device performs one or more actions.

57. The system of any clause herein, wherein the one or more actions comprise transmitting a notification to a computing device for presentation on the computing device.

58. The system of any clause herein, wherein the one or more actions comprise causing a computing device powered by the battery pack to cease operation.

59. The system of any clause herein, wherein the trained machine learning model is trained via supervised learning.

60. The system of any clause herein, wherein the battery pack is used to at least partially power a vehicle, a computing device, or both.

What is claimed is:

1. A computer-implemented method comprising:
receiving, from one or more computing devices, fleet data pertaining to one or more battery packs each comprising one or more first cells, wherein the fleet data comprises one or more false positive images of lithium plating affecting at least a first cell, one or more true positive images of the lithium plating affecting at least a second cell, or both;
training, using at least the fleet data, one or more machine learning models to predict one or more occurrences of the lithium plating;
receiving, from one or more sensors associated with one or more second cells, one or more measurements pertaining to current, voltage, temperature, or some combination thereof; and
inputting the one or more measurements into the one or more machine learning models to predict the one or more occurrences of the lithium plating for the one or more second cells.

2. The computer-implemented method of claim 1, based on the one or more predicted occurrences of lithium plating, performing one or more actions.

3. The computer-implemented method of claim 2, wherein the one or more actions comprise transmitting a notification to a computing device for presentation on the computing device.

4. The computer-implemented method of claim 2, wherein the one or more actions comprise causing a computing device powered by the battery pack to cease operation.

5. The computer-implemented method of claim 1, wherein the training is performed via supervised learning.

6. The computer-implemented method of claim 1, wherein the one or more battery packs are used to at least partially power a vehicle, a computing device, or both.

7. The computer-implemented method of claim 2, wherein the one or more actions comprise automatically removing, via a robot, the one or more second cells predicted to be associated with the one or more occurrences of the lithium plating.

8. A tangible, non-transitory computer-readable medium storing instructions that, when executed, cause a processing device to:
receive, from one or more computing devices, fleet data pertaining to one or more battery packs each comprising one or more first cells, wherein the fleet data comprises one or more false positive images of lithium plating affecting at least a first cell, one or more true positive images of the lithium plating affecting at least a second cell, or both;
train, using at least the fleet data, one or more machine learning models to predict one or more occurrences of the lithium plating;
receive, from one or more sensors associated with one or more second cells, one or more measurements pertaining to current, voltage, temperature, or some combination thereof; and
input the one or more measurements into the one or more machine learning models to predict the one or more occurrences of the lithium plating for the one or more second cells.

9. The computer-readable medium of claim 8, wherein, based on the one or more predicted occurrences of lithium plating, the processing device performs one or more actions.

10. The computer-implemented method of claim 9, wherein the one or more actions comprise transmitting a notification to a computing device for presentation on the computing device.

11. The computer-readable medium of claim 9, wherein the one or more actions comprise causing a computing device powered by the battery pack to cease operation.

12. The computer-readable medium of claim 8, wherein the training is performed via supervised learning.

13. The computer-readable medium of claim 8, wherein the one or more battery packs are used to at least partially power a vehicle, a computing device, or both.

14. The computer-implemented method of claim 9, wherein the one or more actions comprise automatically removing, via a robot, the one or more second cells predicted to be associated with the one or more occurrences of the lithium plating.

15. A system comprising:
a memory device storing instructions;
a processing device communicatively coupled to the processing device, wherein the processing device executes the instructions to:
receive, from one or more computing devices, fleet data pertaining to one or more battery packs each comprising one or more first cells, wherein the fleet data comprises one or more false positive images of lithium plating affecting at least a first cell, one or more true positive images of the lithium plating affecting at least a second cell, or both;
train, using at least the fleet data, one or more machine learning models to predict one or more occurrences of the lithium plating;
receive, from one or more sensors associated with one or more second cells, one or more measurements pertaining to current, voltage, temperature, or some combination thereof; and
input the one or more measurements into the one or more machine learning models to predict the one or more occurrences of the lithium plating for the one or more second cells.

16. The system of claim 15, wherein, based on the one or more predicted occurrences of lithium plating, the processing device performs one or more actions.

17. The system of claim 16, wherein the one or more actions comprise transmitting a notification to a computing device for presentation on the computing device.

18. The system of claim 16, wherein the one or more actions comprise causing a computing device powered by the battery pack to cease operation.

19. The system of claim 15, wherein the training is performed via supervised learning.

20. The system of claim 15, wherein the one or more battery packs are used to at least partially power a vehicle, a computing device, or both.

* * * * *